US006829574B1

(12) United States Patent
Ito et al.

(10) Patent No.: US 6,829,574 B1
(45) Date of Patent: Dec. 7, 2004

(54) LOGIC EMULATION MODULE AND LOGIC EMULATION BOARD

(75) Inventors: Hiroshi Ito, Atsugi (JP); Akira Yamagiwa, Naka-gun (JP); Nobuaki Ejima, Hadano (JP); Ryoichi Kurihara, Hadano (JP); Masakazu Sakaue, Atsugi (JP); Yasuhiro Uemura, Hadano (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 09/328,800

(22) Filed: Jun. 9, 1999

(30) Foreign Application Priority Data

Jun. 10, 1998 (JP) .......................................... 10-161813

(51) Int. Cl.[7] .............................................. G06F 9/455
(52) U.S. Cl. .............................. 703/28; 703/23; 703/25; 703/15; 714/29; 714/725
(58) Field of Search ............................. 703/28, 26, 23, 703/15; 364/578

(56) References Cited

U.S. PATENT DOCUMENTS

| | | | | |
|---|---|---|---|---|
| 5,331,571 A | * | 7/1994 | Aronoff et al. ............. | 324/73.1 |
| 5,334,875 A | * | 8/1994 | Sugano et al. .............. | 257/686 |
| 5,339,262 A | * | 8/1994 | Rostoker et al. ........... | 702/117 |
| 5,440,453 A | * | 8/1995 | Cooke et al. ............... | 361/790 |
| 5,462,442 A | * | 10/1995 | Umemura et al. .......... | 439/654 |
| 5,572,710 A | * | 11/1996 | Asano et al. ................ | 703/15 |
| 5,574,388 A | * | 11/1996 | Barbier et al. .............. | 326/41 |
| 5,575,686 A | * | 11/1996 | Noschese .................... | 327/262 |
| 5,604,888 A | * | 2/1997 | Kiani-Shabestari et al. ... | 703/23 |
| 5,636,997 A | * | 6/1997 | Kuroda et al. ............... | 439/74 |
| 5,640,337 A | * | 6/1997 | Huang et al. ............... | 324/527 |
| 5,748,875 A | * | 5/1998 | Tzori .......................... | 714/29 |
| 5,781,415 A | * | 7/1998 | Itoh ........................... | 361/790 |
| 6,005,771 A | * | 12/1999 | Bjorndahl et al. .......... | 361/699 |
| 6,006,022 A | * | 12/1999 | Rhim et al. ................. | 703/26 |
| 6,009,259 A | * | 12/1999 | Ikeda et al. ................. | 703/23 |
| 6,016,563 A | * | 1/2000 | Fleisher ...................... | 714/725 |
| 6,128,194 A | * | 10/2000 | Francis ....................... | 235/492 |
| 6,570,404 B1 | * | 5/2003 | Norman et al. ............. | 326/39 |

FOREIGN PATENT DOCUMENTS

| JP | 405160591 A | * | 6/1993 | ............ H05K/7/20 |
|---|---|---|---|---|
| JP | 6-3414 | | 1/1994 | |

OTHER PUBLICATIONS

"A Novel Approach to Real–Time Verification of Transport System Design using FPGA based Emulator", K. Hayashi, IEEE 0–8186–7603–5/96, 1996 IEEE.*

* cited by examiner

*Primary Examiner*—Kevin J. Teska
*Assistant Examiner*—Fred Ferris
(74) *Attorney, Agent, or Firm*—Mattingly, Stanger & Malur, P.C.

(57) ABSTRACT

Disclosed herein is an improved logic module used for logic emulation along with an enhanced logic emulation board subject to logic verification. The logic module has a plurality of programmable LSIs capable of programming logic and a plurality of switching LSIs capable of programming connections, the LSIs being mounted on one or both sides of a board. Peripheral portions of the board carry connectors for electrical connection to the outside. There are two types of data lines: those directly coupling the connectors to the programmable LSIs, and those linking the connectors to the programmable LSIs via the switching LSIs. The programmable and switching LSIs constitute a crossbar connection arrangement. The logic emulation board has connectors for connection to a logic emulation module, and lands for supporting LSIs targeted for development. Pins of the connectors and the lands are interconnected on a one-to-one basis. Also disclosed here is an upgraded module structure permitting a multiple-stage module setup together with an advanced cooling structure for modules.

13 Claims, 11 Drawing Sheets

LOGIC EMULATION MODULE AND LOGIC EMULATION BOARD

BACKGROUND OF THE INVENTION

The present invention relates to techniques of logic emulation constituting one of the processes for developing integrated circuits. More particularly, the invention relates to a logic emulation module and a logic emulation board for carrying out logic emulation efficiently.

Heretofore, there were techniques of software emulation (logic simulation) designed to improve accuracy in logically verifying logic elements that make up large-scale integrated circuits (LSI) for use in information processing equipment. Such software emulation techniques have since been supplemented by techniques of hardware emulation (logic emulation) that utilize FPGAs (field programmable gate arrays) forming programmable LSI. Logic emulation involves programming, by use of a plurality of FPGAS, a pseudo-LSI device that emulates the logic of a target LSI to be designed (i.e., targeted for logic verification) and generating the programmed pseudo-LSI for checks on its logical performance. One such logic verification device is disclosed illustratively in Japanese Published Unexamined Patent Application No. Hei 6-3414.

Large-scale integrated circuits targeted for development come most often in the form of a multi-chip module or a CSP (chip size package). A multi-chip module is made up of a plurality of LSI chips mounted in bare fashion on a board. A CSP is constituted by a bare chip mounted on a board called a carrier, the chip being soldered onto the board by ball bonding.

Any LSI under development and its corresponding FPGA differ in package sizes, connecting structures and pin assignments. To overcome the differences requires newly designing a logic verification board that will carry the FPGA intended for logic emulation. Package of FPGAs are generally structured as PGA (pin grid array), QFP (quad flat package) or BGA (ball grid array). To combine a plurality of FPGAs thus requires constructing an emulation device wherein the board for carrying the arrays is sufficiently enlarged or wherein the arrays are logically divided into a plurality of boards to be connected by means of a back plane board. In such cases, appropriate connecting means must be provided between the emulation device and the logic board that bears the LSI being developed.

SUMMARY OF THE INVENTION

It is therefore an object of the present invention to provide a logic module for logic verification and a logic emulation device, whereby the number of logic emulation steps is reduced.

It is another object of the present invention to provide a logic module for logic verification and a logic emulation device, such that there is no need to design a logic verification board anew.

It is a further object of the present invention to provide techniques for implementing efficient cooling of a multi-chip module through heat conduction.

In carrying out the invention and according to one aspect thereof, there is provided a logic module comprising: a board; at least one FPGA and at least one switching LSI mounted on at least one side of the board, the FPGA allowing internal gates to be programmed for logic implementation, the switching LSI permitting circuit interconnections to be programmed; connectors attached to the board for electrical connection with the outside; board wiring for directly connecting the FPGA to the connectors; and board wiring for coupling the FPGA to the connectors by way of the switching LSI.

According to another aspect of the invention, there is provided a logic board targeted for logic verification, comprising: connectors for connection with logic modules; and terminal lands on which to mount LSIs to be developed; wherein the connectors and the terminal lands are interconnected on a one-to-one basis.

A logic module has its connectors coupled to those of the logic board so that the module is mounted on the board targeted for verification. The logic board, on which an LSI to be developed is to be actually mounted, is thus prepared for logic verification. After the verification, the logic module may be dismounted from the logic board and the target LSI may be mounted on the board for evaluation.

If an FPGA is needed, two or more logic modules of the above type may be stacked connectively through external-coupling connectors of the modules. This multiple-stage logic module arrangement makes it possible to expand the logic scale per unit packaging area.

If the number of external terminals for LSIs mounted on one side of a logic module differs from the external terminal count on the other side, boards called LSI carriers may be used to arrange the terminal assignments into an identical land layout on both sides. With the two sides of the logic module having the same land layout, through-holes alone on the logic module board may be used to connect the identically located signal terminal lands, power supply lands and ground terminal lands. This provides a considerable improvement in the ease of design.

Preferably, radiation plates may be attached to four corners of the inventive logic module with metal spacers interposed therebetween. Between the radiation plates on the one hand and various LSIs such as FPGAs and switching LSIs attached to the logic module on the other hand, there may be provided heat conduction sheets that elastically conform to and snugly contact the shapes of these LSIs. Heat from the LSIs is dissipated through the heat conduction sheets and radiation plates. Because the heat conduction sheets elastically follow the LSI contours, LSIs of different heights mounted on the same board surface may still have their different elevations covered by the sheets. Since the radiation plates are attached to the four corners of the logic module with metal spacers interposed, it is possible to implement a cooling structure that will not interfere with component layout and wiring design.

If a plurality of logic modules are stacked connectively, the heat from a lower-stage logic module may be thermally conducted through the flexibly bending heat conduction sheets to the radiation plates of an upper-stage logic module. The structure permits efficient cooling of the multiple-stage logic module setup.

Other objects, features and advantages of the invention will become more apparent upon a reading of the following description and appended drawings.

DESCRIPTION OF THE PREFERRED EMBODIMENTS

Figures 1, 2:
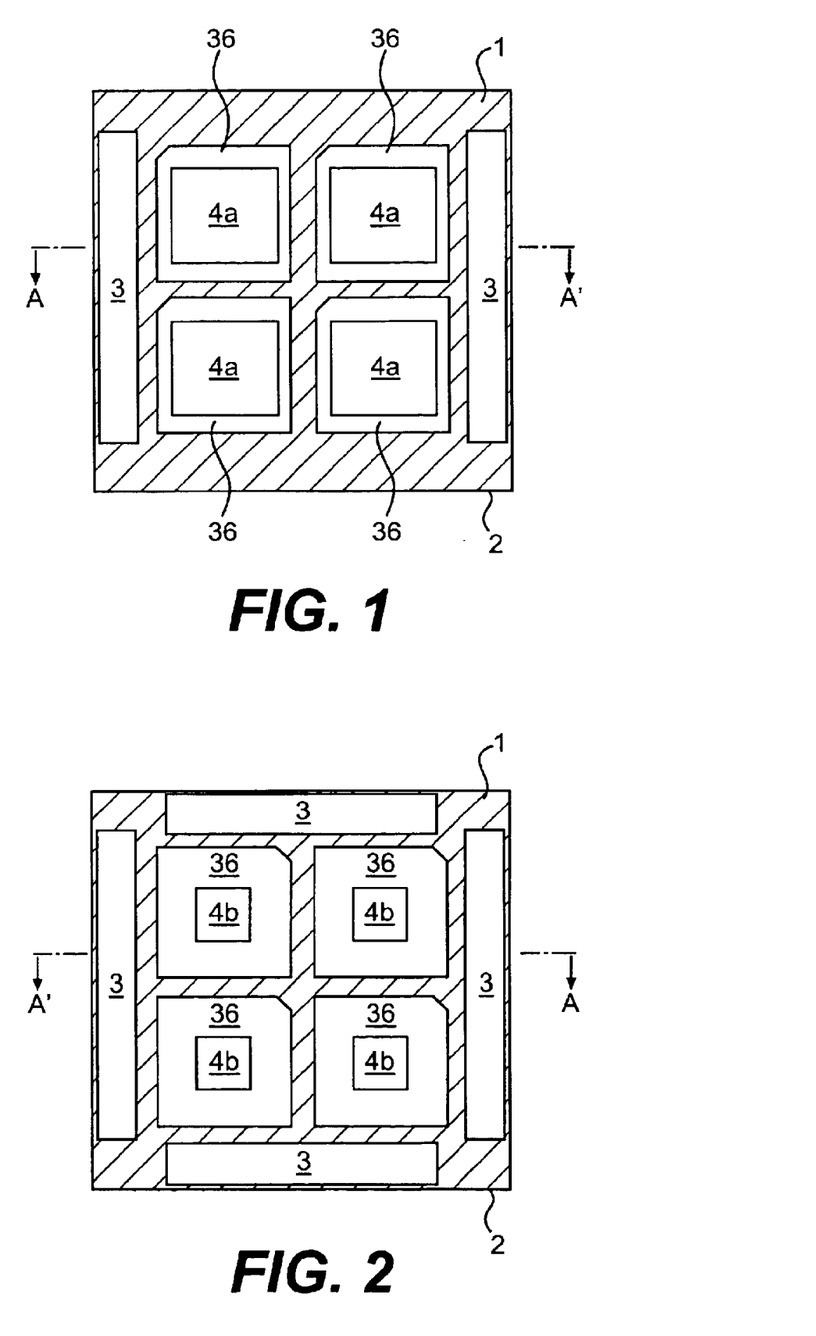
FIG. 1 is a top view of a logic module practiced as a first embodiment of the invention.
FIG. 2 is a bottom view of the logic module embodying the invention.
Figure 3:
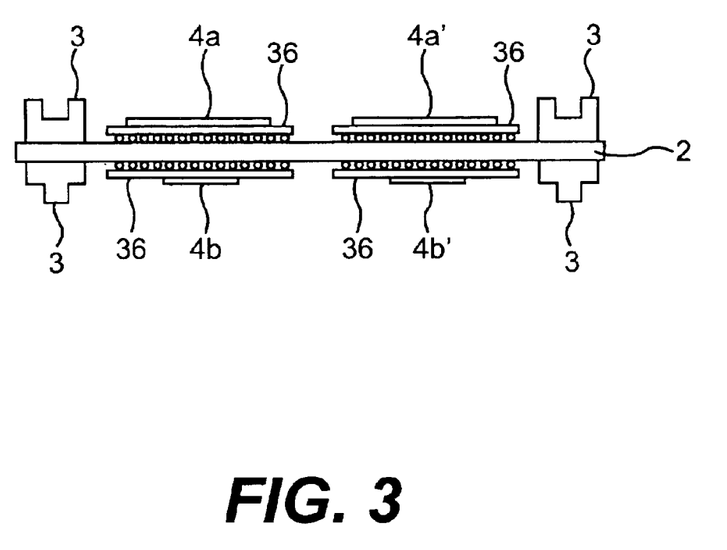
FIG. 3 is a cross-sectional view taken on line A—A of the logic module shown in FIGS. 1 and 2.

Preferred -embodiments of this invention will now be described with reference to the accompanying drawings. FIGS. 1 through 3 show the first embodiment of a logic module according to the invention. FIG. 1 is a top view of the logic module; FIG. 2 is a bottom view of the logic module; and FIG. 3 is a cross-sectional view taken on line A–A' in FIGS. 1 and 2.

As shown in FIG. 1, the face of a module board 2 supports four programmable LSIs 4a (typically FPGAS), with boards 36 called carriers interposed between the board and the LSIs. The carriers 36 will be described later with reference to FIGS. 4 and 5. The periphery of the module board 2 carries connectors 3 for electrically and physically connecting the programmable LSIs 4a and switching LSIs 4b (in FIG. 2) to entities outside the logic module.

As depicted in FIG. 2, the back of the module board 2 supports four programmable LSIs 4b with the carriers 36 interposed therebetween. There are four connectors 3 for electrically and physically connecting the programmable LSIs 4a and switching LSIs 4b to the outside. A plurality of connectors including the many connectors for connection to external entities permit higher degrees of freedom in designing pseudo-LSIs. Although the face of the logic board has only two connectors, this is not limitative of the invention. As with the board back, the face may have more connectors mounted on its two remaining sides.

FIG. 3 is a cross-sectional view taken on line A–A' of the logic module 1. The first embodiment has the programmable LSIs 4a and switching LSIs 4b arranged in a ball grid array (BGA), i.e., laid out at constant intervals apart and connected by ball bonding. The solder ball spacing of this BGA is made smaller than the conventional 1.27 mm interval to reduce packaging area in order to expand the logic scale per unit area. This type of BGA is called FBGA (fine pitch BGA) or CSP (chip size package). LSI manufacturers have proposed ball-to-ball distances of 1.0 mm, 0.8 mm, 0.75 mm, 0.65 mm and 0.5 mm to JEDEC and EIJA. Large-scale logic verification may be implemented by mounting a plurality of LSIs 4a and 4b on both sides of the module board 2, as is the case with the first embodiment.

Figure 4:
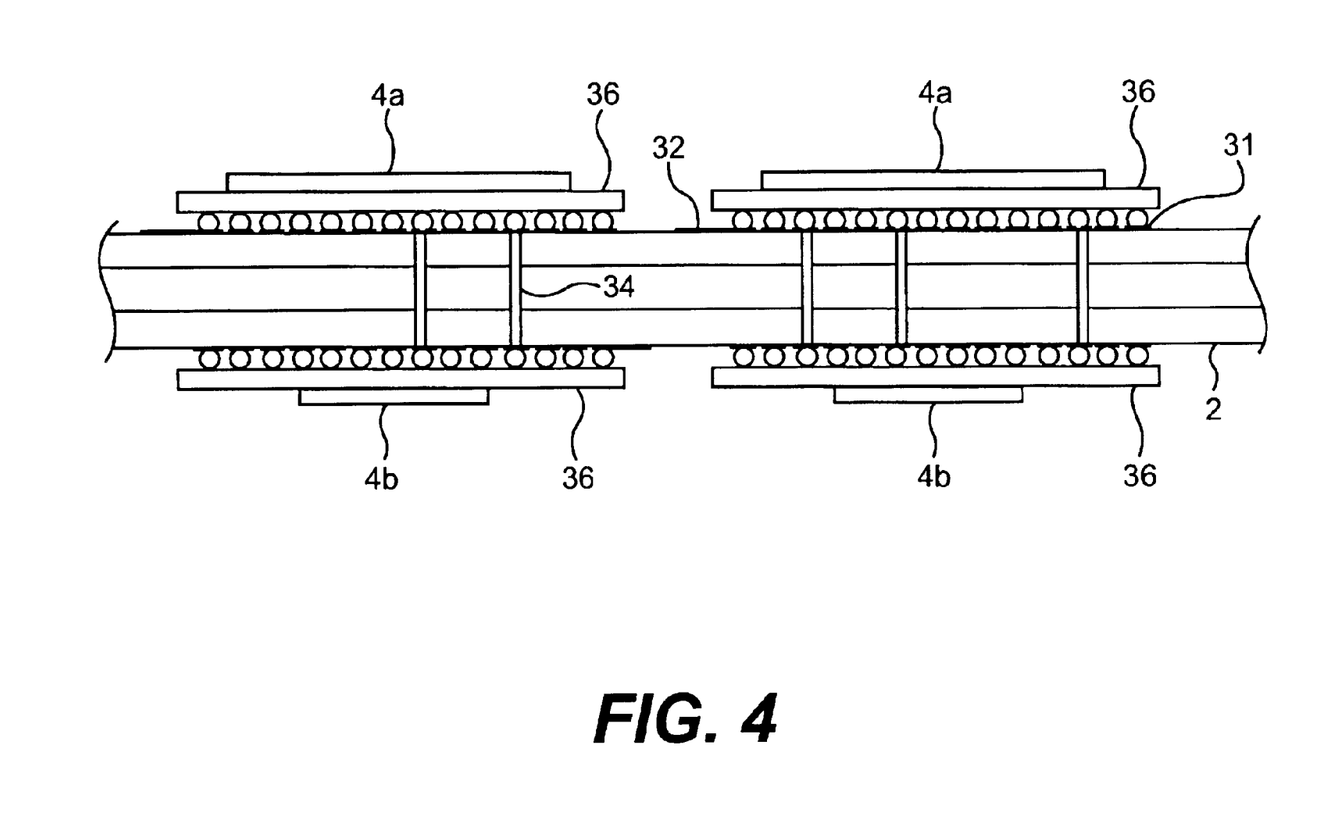
FIGS. 4 and 5 are schematic views showing how the inventive logic module is typically wired.
Figure 5:
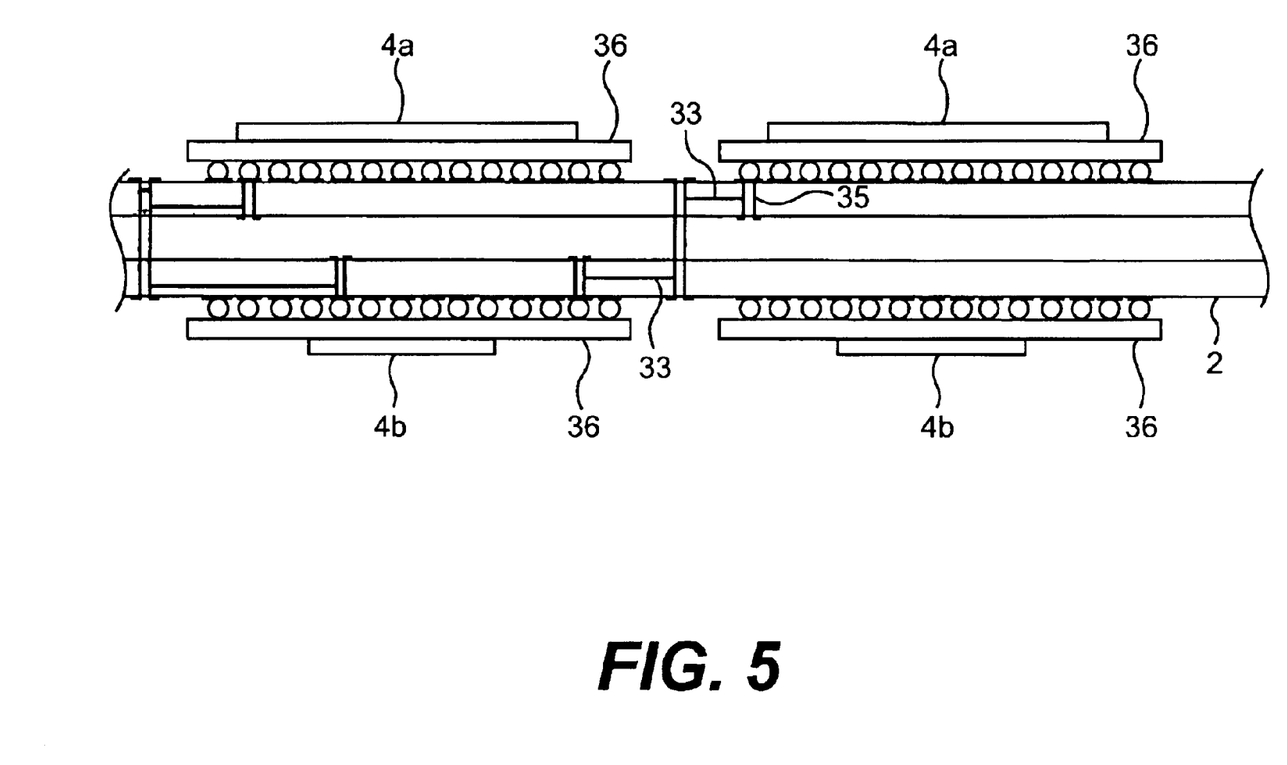

In FIG. 3, the LSIs 4a and 4b as well as the connectors are mounted in opposite fashion on both sides of the module board 2. How the components are supported by the face and back of the board is described below with reference to FIGS. 4 and 5. FIGS. 4 and 5 are enlarged cross-sectional views of the logic module 1 in FIG. 3, showing how the LSIs 4a and 4b are wired.

FIG. 4 depicts a case in which the LSIs 4a and 4b mounted in opposite fashion on both sides of the board are interconnected on a one-to-one basis. The face and back of the module board 2 support lands 31 and external wiring layers 32 connected to terminals of the LSIs 4a and 4b with the carriers 36 interposed therebetween. The external wiring layers 32 are located illustratively between the four LSIs 4a and 4b for connection therewith in the middle of the module board. The LSIs on both sides of the module board 2 are interconnected across the board by through-holes 34 which are positioned where appropriate and which connect the lands 31 with the external wiring layers 32.

FIG. 5 shows how to connect not only the LSIs 4a and 4b positioned in opposite relation with one another on both sides of the module but also LSIs 4a and 4b otherwise located. Blind holes 35 are provided on the two sides to connect the external and internal wiring layers 32 and 33. The logic LSIs 4a and 4b in asymmetrically opposed relation to one another are interconnected by the internal wiring layers 33, with blind holes 35 connected to through-holes 34 inside the module board 2.

The connectors, programmable LSIs and switching LSIs constituting the logic module are linked by the throughholes 34 shown in FIG. 4, and by the blind holes 35 and internal wiring layers 33 in FIG. 5.

In FIGS. 4 and 5, if the number of external terminals of LSIs 4a and 4b on one side of the logic module 1 differs from the external terminal count on the other side, the carriers 36 may be used to arrange the terminal assignments into an identical land layout on both sides. This provides a correspondingly opposite packaging setup on the face and back of the board, making connections easier by use of the through-holes 35. Illustratively, the LSIs 4a on the face and the LSIs 4b on the back may be mounted on lands which are arranged in opposite fashion across the board and which accommodate the signal terminals of the same signals, terminals of the same power supply, and ground terminals of the LSIs in question. This arrangement allows the connectors to be coupled directly by means of through-holes 34, which makes wiring design easier. If the lands for the above-described terminals are not located in opposite relation with one another across the board, they are connected by means of blind holes 35 spanning the internal wiring layers 33 and by appropriately located through-holes 34, as shown in FIG. 5. The same also applies to the connectors positioned in opposite fashion on both sides of the board.

Although not shown for the first embodiment, the LSIs mounted on the same surface are connected by means of the external wiring layers 32 through the blind holes 35 and internal wiring layers 33. Thus the regions for wiring between the LSIs 4a and 4b are constituted by element placement lands 31 and by regions for wiring with the through-holes 34 connected to the blind holds 35 via the internal wiring layers 33. The structure boosts packaging efficiency and contributes to reducing the size of the logic, module.

The first embodiment adopts a hole-on-pad arrangement in which through-holes are formed directly under the element placement lands 31. Alternatively, the through-holes may be located in offset relation with the lands 31.

Figure 6A:
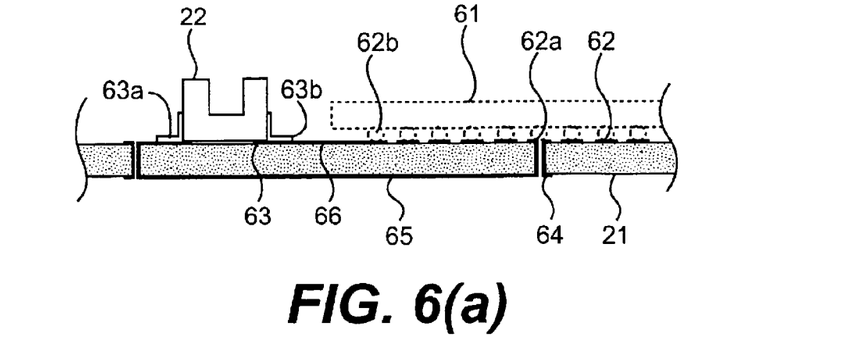
FIGS. 6A and 6B are a partial cross-sectional view and a plan view of a logic board where a logic module is to be mounted.
Figure 6B:
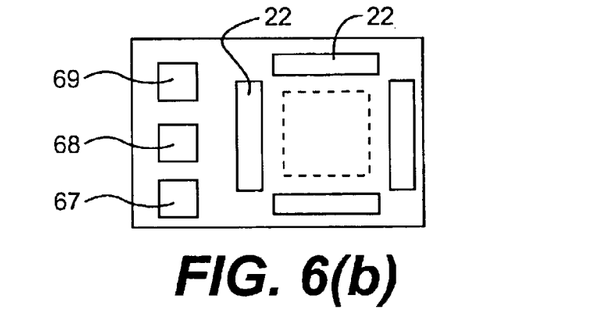

The module board 2 is a serially layered board pierced with through-holes and made up of two multi-layer boards bonded together, each multi-layer board having an external wiring layer 32 and at least one internal wiring layer 33 interconnected by through-holes. Alternatively, the module board 2 may be a build-up board having both through-holes and blind holes for linearly connecting the external wiring layer with desired internal wiring layers. FIGS. 6A and 6B depict a logic board 21 for supporting the logic module 1. FIG. 6A is a cross-sectional view of the logic board 21 on which to mount the logic module 1. The logic board 21 comprises stacking type receptacle connectors 22 to which to connect the logic module 1, lands 63 carrying the connectors, and a land 62 for upholding an LSI 61 targeted for development. The logic module 1 is equivalent in size to the LSI 61 being developed. The land 62 is located under the module 1.

Suppose that in FIG. 6A, a terminal (e.g., ground terminal) of the target LSI 61 connected to a land 62a has the same function as a terminal 63a of the connector 22 coupled to the logic module 1. In such a case, the land 62a is linked to the connector 22 via through-holes 64 and wiring 65 on the back of the logic board 21. Similarly, a land 62b is connected to a terminal 63b via wiring 66 on the face of the logic board 21. In other words, the lands 63 carrying the connectors and the lands 62 supporting the target LSIs 61 are interconnected on a one-to-one basis. By such an arrangement wherein the land 62 carrying the logic module 1 is connected to the land 63 supporting the connectors on a one-to-one basis, it is possible to mount both the logic module 1 and the target LSI 61 on the same logic board 21.

FIG. 6B is a plan view of the logic board 21. The logic board 21 has four connectors 22 with respect to one logic module 1. The logic board 21 also carries other elements 67, 68 and 69 for use in logic verification of non-targeted LSIs such as processors and memories connected to the connector lands 63 and the target LSI lands 62.

Figure 7:
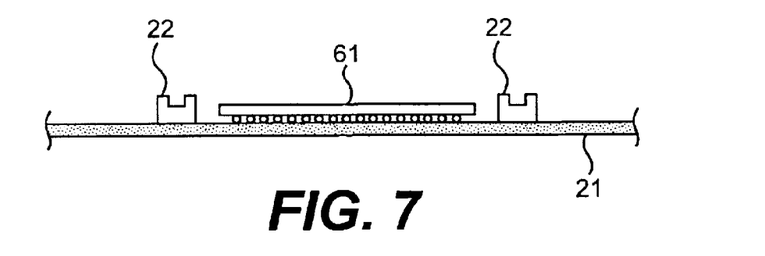
FIG. 7 is a schematic view of a logic board carrying an LSI under development.

FIG. 7 schematically shows the logic board 21 carrying the LSI 61 under development. After logic verification, the logic module 1 may be dismounted from the board 21 and the target LSI 61 may be attached to the board for evaluation. There is no need for designing a logic board 21 anew for evaluating the target LSI following its logic verification. The connectors 22, left intact on the logic board 21, may be used as terminals for waveform observation while the target LSI 61 is being evaluated.

Figure 8:
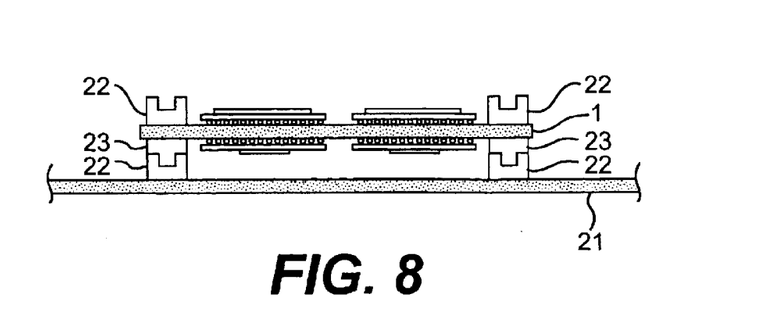
FIG. 8 is a schematic view of the inventive logic module mounted on a logic board.

FIG. 8 is a schematic view of the inventive logic module 1 as it is mounted on the logic board 21. The logic module 1 and the logic board 21 are connected by means of connectors 23 located on the back of the logic module 1, and by the connectors 22 furnished on the logic board 21 in opposite relation with the connectors 23. In the first embodiment, the connectors 23 on the back of the logic module 1 are stacking type plug connectors while the connectors 22 on the logic board 21 are stacking type receptacle connectors.

With the first embodiment, the face of the logic module 1 also has connectors 22b for stacking another logic module 1. The stacking connectors 22b need not be of the same type as the connectors on the logic board 21. However, it is preferred that the face of the module have stacking type receptacle connectors 22 of the same type as that of the connectors on the logic board 21 in opposite relation with the connectors on the back side. The arrangement facilitates the connection of signal lines in stacking two more logic modules 24 of the same function or a plurality of logic modules 25 having different functions. Such a multi-stage module makeup promotes expansion of the logic scale and extensions in functionality.

Figure 9A:
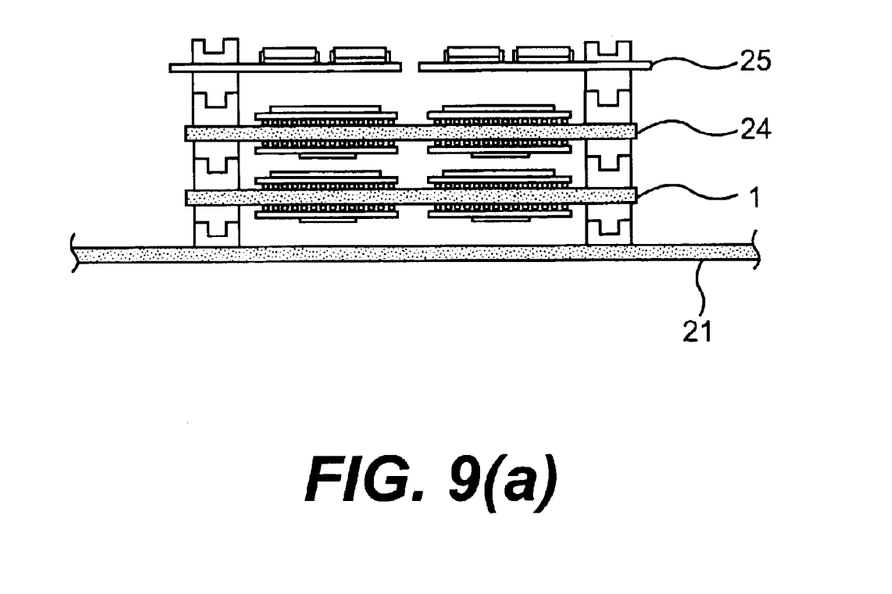
FIGS. 9A and 9B are schematic views of multiple-stage logic module setups according to the invention.
Figure 9B:
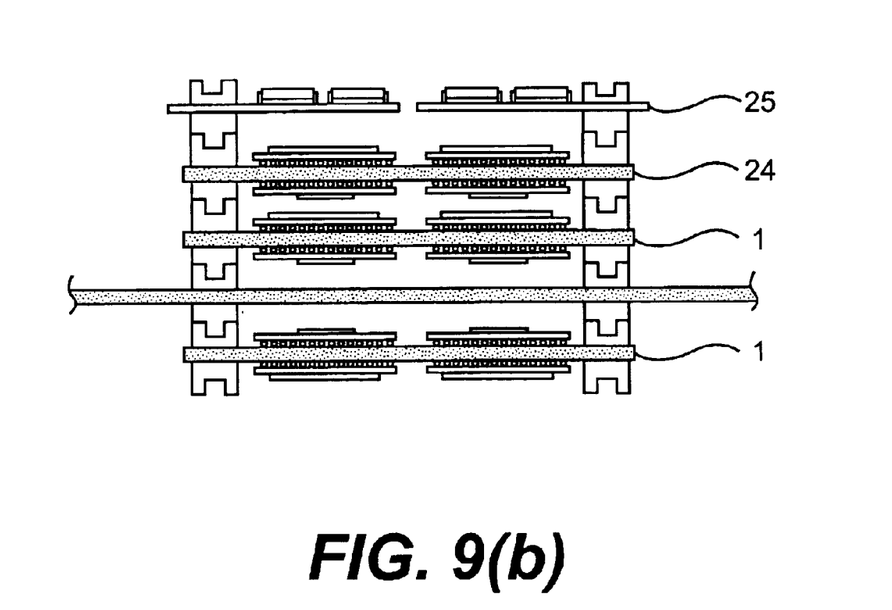

FIGS. 9A and 9B are schematic views of multiple-stage logic module setups according to the invention. FIG. 9A shows a case in which one side of the logic board 21 supports logic modules 1, 24 and 25. The logic modules to be stacked need not have the same function. These modules may illustratively comprise a logic module of circuits for setting a configuration upon logic verification, and a logic module made up of memory circuits.

As described above, the connectors on the face of the logic module 1 and those on the back side may be located so that terminals of the same power supply, ground terminals, and control terminals of clock, reset and other signals may correspond to one another in opposite fashion on the two sides of the module. The arrangement permits a plurality of logic modules to be stacked in any desired sequence.

Furthermore, the connectors on the face of the topmost logic module 25 may be used as terminals for waveform observation in logic verification.

FIG. 9B shows a case wherein logic modules 1 are mounted on both sides of the logic board 21. The logic board 21 has the connectors on one side located in opposite relation with those on the other side, the connectors allowing logic modules 1 to be mounted on both sides of the logic board 21. Although the back of the logic board 21 for the first embodiment is shown supporting one logic module, this is not limitative of the invention. Alternatively, the back side may have a plurality of modules stacked in the same manner as the face side.

Figure 10:
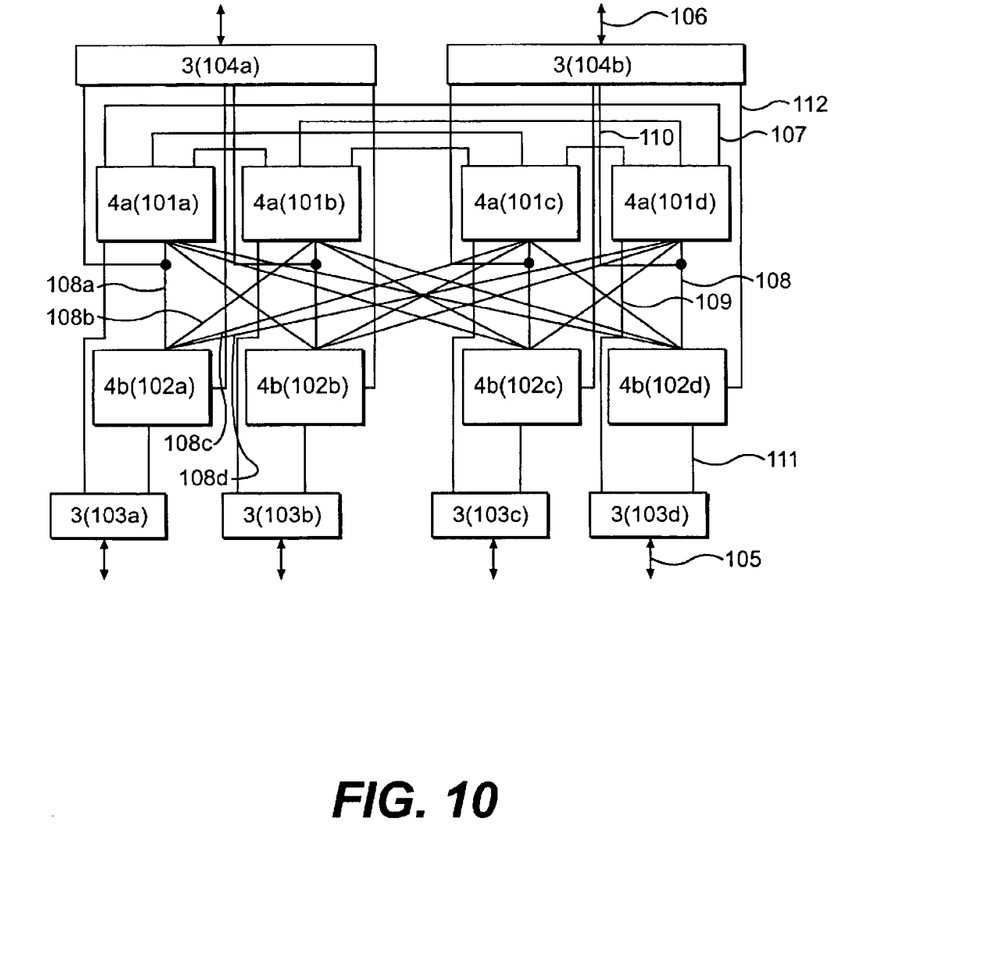
FIG. 10 is a diagrammatic view indicating how logic circuits of the logic module are typically wired.
Figure 11:
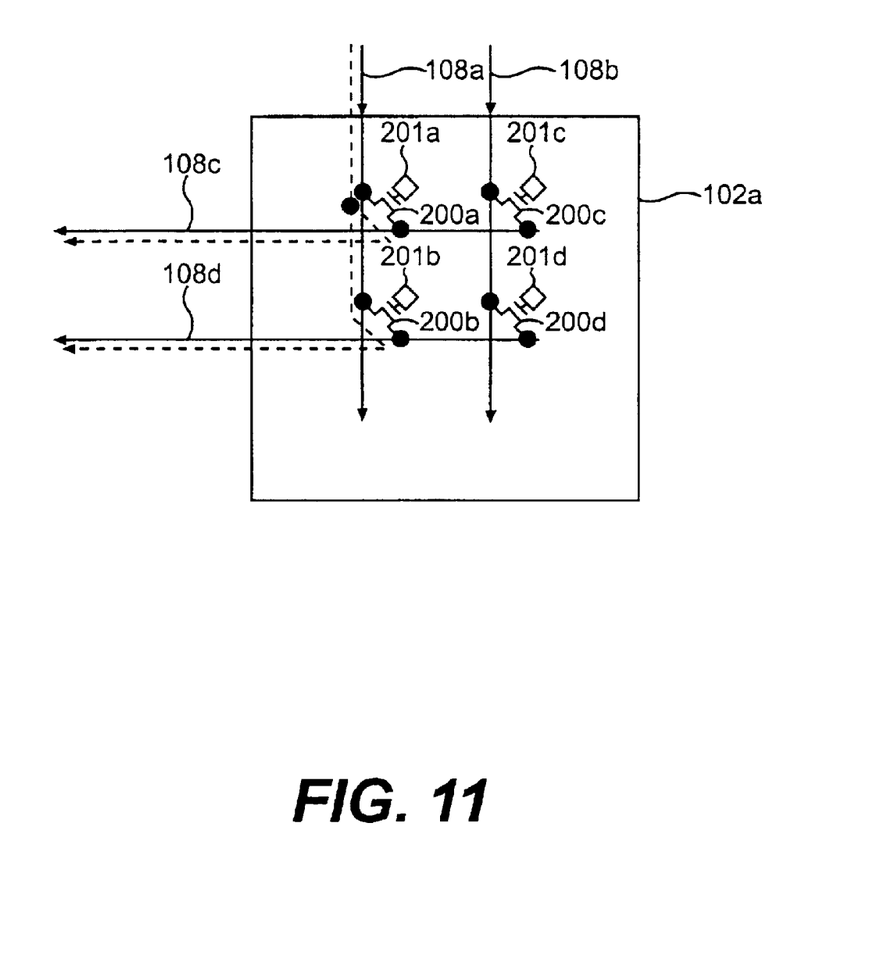
FIG. 11 is a schematic view of internal circuits in a switching LSI.

Logical connections of the inventive logic module 1 will now be described with reference to FIGS. 10 through 12. FIG. 10 is a diagrammatic view indicating how logic circuits of the logic module 1 are typically wired.

The logic module 1 comprises programmable LSIs 4a (101a to 102d) for programming logic circuits such as FPGAs switching LSIs 4b (102a to 102d) for programming connections between external terminals, interface connectors 3 (103a to 103d) for interfacing with a logic board or other device external to the logic module 1, interface connectors 3 (104a, 104b) for interfacing with another logic module or like external device, and logic signal lines 108 through 112 for interconnecting the components.

The programmable LSIs 101a through 101d have a plurality of logic data programmed to represent divided logic circuits of the target LSI so that large-scale logic verification is carried out using the logic module 1. To connect the divided logic circuits in the programmable LSIs 101a through 101d requires setting up connections between the LSIs 101a through 101d. A one-to-one network connecting two of the programmable LSIs 101a through 101d is implemented by use of logic signal lines 107 for such network purposes. A one-to-two network and other networks involving the connection of more than two programmable LSIs requires using signal lines 108 by way of the switching LSIs 102a through 102d.

The switching LSIs 102a through 102d interconnect by programming the programmable LSIs 101a through 101d or the interface connectors 103a through 103d, 104a and 104b. FIG. 11 is a schematic view of internal circuits in the switching LSI 102a. The switching LSI 102a is made up of MOS transistors 200a through 200d and storage elements 201a through 201d. Logic signal wires 108a through 108d, connected to the switching LSI 102a, are also coupled to the programmable LSIs 101a through 101d respectively.

Typically, the logic signal line 108a is connected via the MOS transistors 200a through 200d to the logic signal lines 108b through 108d inside the switching LSI 102a. To establish a one-to-two network wherein the logic signal line 108a is to be connected to the logic signal lines 108b and 108c requires writing logic data to the storage elements 201a and 201b so as to turn on the MOS transistors 200a and 200b. It is also necessary to write logic data to the storage elements 201c and 201d in order to activate the MOS transistors 200c and 200d. This connects the logic signal lines 108a, 108c and 108d. That is, a desired connective setup is acquired by writing appropriate connection data to the storage elements 201a through 201d in the switching LSI 102a.

Returning to FIG. 10, the device interface connectors 103a through 103d serve to connect the logic module 1 with the logic board. Signal lines 109 from the programmable LSIs 101a through 101d are directly connected to the device interface connectors 103a through 103d. If there are constraints on connector pin assignments, signal lines 111 may be selected by the switching LSIs 102a through 102d for the connection by way of the signal lines 108.

As with the device interface connectors 103a through 103d, the external interface connectors 104a and 104b may be connected in one of two ways: either signal lines 110 directly connectable to the programmable LSIs are used for the connection, or signal lines 112 are selected by the switching LSIs 102a through 102d for the connection by way of the signal lines 108.

When an oscilloscope is connected to any one of the external interface connectors 104a through 104d to observe signals between a RAM module on the one hand and the FPGAS 101a through 101d on the other hand, it is possible to establish the connection through the signal lines 110 and 108a through 108d.

Conventionally, where all lines between the FPGAs 101a through 103d were connected to the switching LSIs 102a through 102d via the signal lines 108a through 108d, there was a bottleneck: the degree of freedom in wiring was increased but the number of I/O pins on the switching LSIs 102a through 102d became limited. Where only the logic signal lines 107 were used to wire the FPGAs 101a through 101d, there was the problem of losing the degree of freedom in pin assignments on the FPGAs 101a through 101d, which lowered logic packaging density. According to the invention, the FPGAs and the switching LSIs are mounted on both sides of the logic module 1 in opposite relation with one another. This makes it possible to achieve an optimum trade-off between the above-described two connecting methods, allowing a high degree offreedom in wiring while minimizing the number of pins on the switching LSIs.

Where the first embodiment is implemented, as is in general practice these days, with 380 pins for the programmable LSIs, 320 pins for the switching LSIs, and 112 pins for the connectors, the external interface connectors are connected to the following lines: 38 out of the lines between the programmable LSIs, 55 of the lines between the programmable LSIs on the one hand and the switching LSIs on the other hand, 75 of the lines between the device interface connectors on the one hand and the switching LSIs on the other hand, 37 of the lines between the device interface connectors on the one hand and the programmable LSIs on the other hand, 25 of the lines between the switching LSIs on the one hand and the external interface connectors on the other hand, and 31 of the lines between the programming LSIs on the one hand and the paired switching LSIs on the other hand. There is an optimal trade-off in terms of divided wiring between the direct coupling of the interface connectors to the programmable LSIs for high-speed network performance on the one hand, and a high degree of freedom in pseudo-LSI design on the other hand.

The lines whose numbers were mentioned above include control line such as "WRITE COMMAND" and "WRITE DATA" for the mapping of divided logic circuits of pseudo-LSIs into the programmable LSIs and switching LSIs, as well as power supply and ground lines for use by the programmable and switching LSIS. Aside from the power supply lines, the embodiment of the invention is particularly noted for the fact that, of the data lines (user pins) used for data and control signal exchanges during emulations following the mapping of pseudo-LSI data, the lines directly linking the connectors to the programmable LSIs are located in mixed fashion with those connected through the switching LSIs to one of the programmable LSIs. The switching LSIs and the programmable LSIs are interconnected in a crossbar connection arrangement.

Figure 12:
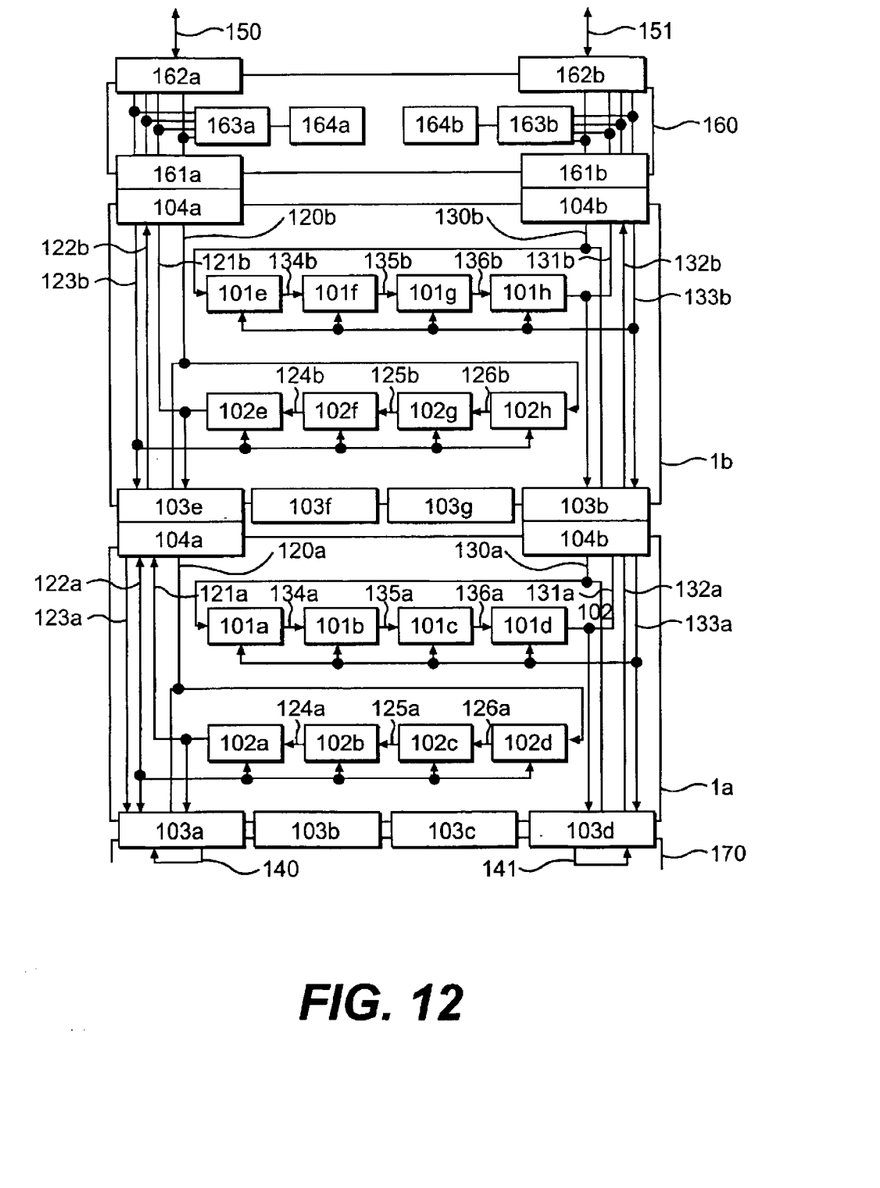
FIG. 12 is a conceptual view illustrating how control circuits of the logic module are typically wired.

FIG. 12 shows a multiple-layer logic emulation device similar to one of those in FIG. 9, wherein a logic module 1b and a log control board 160 are mounted on top of a logic module 1a, the components being in turn mounted on a logic board 21.

In the logic module 1a, the lines for logic data write control signals are constituted by control signal lines 130a through 136a for the programmable LSIs 101a through 101d and by control signal lines 120a through 126a for the switching LSIs 102a through 102d.

Likewise, in the logic module 1b, the lines for logic data write control signals are constituted by control signal lines 130b through 136b for the programmable LSIs 101e and 101f and by control signal lines 120b through 126b for the switching LSIs 102e and 102f.

The control circuit logic board 160 is made up of ROMs 164a and 164b in which logic data are written, and of control circuits 163a and 163b.

Logic data programmed in the programmable LSIs 101e through 101h are output illustratively from the ROM 164a to the control signal line 134b through the control circuit 163b., control signal line 130b, and programmable LSI 101e. From the control signal line 134b, the data are sent to the programmable LSIs 101f through 101h in the next stage. Then the data are forwarded from the logic module 1b to the logic module 1a through the control signal line 131a. In the logic module 1a, as in the logic module 1b, the data are transferred from the control signal line 130a to the programmable LSIs 101a and 101b via the control signal lines 134a through 136a. Past an external line 141 and through the control signal lines 132a and 132b, the data are returned to the control circuit logic board 160. Control signals to be input parallelly into the programmable LSIs 101 are conveyed over the control signal lines 133b and 133a by way of the control circuit logic board 160.

In the manner described, logic write operations are made possible where a plurality of logic modules are mounted on one logic module. The same control signal lines are connected as terminals to both the external interface connectors 104a and 104b and the device interface connectors 103a and 103b. This setup allows the logic circuits of the control circuit logic board 160 to be mounted and controlled on a device board 170. Where the control signals are connected to both the device interface connector 103 and the external interface connector 104, control operations may be effected through the two connectors.

If a single logic module la is to be controlled, continuous control signals are input to the control circuit logic board 170 by way of the control signal line 130a, programmable LSIs 101a through 101d, and control signal line 131a. This arrangement eliminates the need for the external line 141 of the device board 170.

Although handling of logic data was shown limited to the control circuit logic board 160 above, this is not limitative of the invention. Alternatively, a terminal of a personal computer or like equipment may be connected to an external terminal 151. In that case, the control circuit logic board 160 is taken over by the PC for control purposes.

Figure 13:
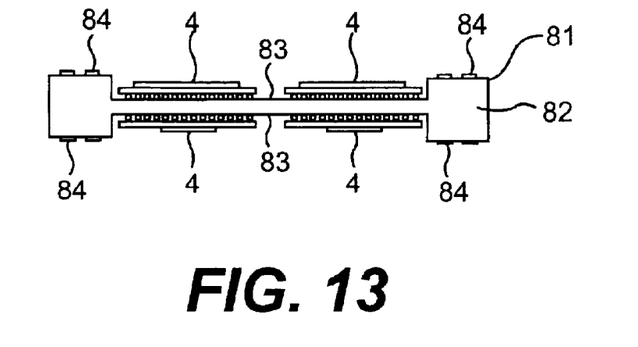
FIG. 13 is a schematic view of a logic module practiced as a second embodiment of the invention.

FIG. 13 is a schematic view of a logic module practiced as the second embodiment of the invention. A logic module 81 has cavities 83 formed on one or both sides of a module board 82. A plurality of logic LSIs 4 are installed in the cavities. Peripheral portions of the board are furnished with terminal lands 84 for electrical connection to the outside. The height of the logic LSIs 4 is accommodated by the depth of the cavities. The external connection terminal lands provide connection to a logic board and permit stacking a plurality of logic modules of the same or different functions.

The terminal lands 84 are positioned so that power supply and ground terminals, as well as control terminals for clock, reset, and other signals may be positioned in opposite relation with one another on the board. This arrangement allows a plurality of modules to be stacked in any order desired. The terminal lands 84 are connected to the corresponding terminals illustratively by soldering.

In making connections by soldering, it is possible to take advantage of the substance possessing a property of self-alignment by surface tension. That is, slight misalignments of connections are absorbed by solder with its self-aligning characteristic. For example, if the connective misalignment is up to one-third of the land diameter, the self-alignment effect is expected to fully compensate the discrepancy.

Figure 14A:
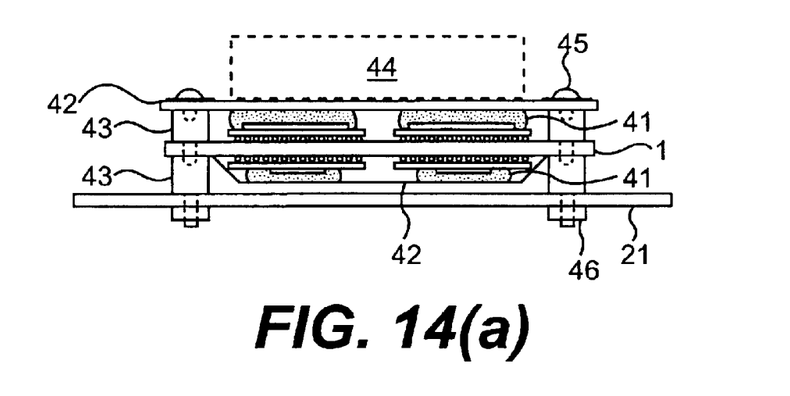
FIGS. 14A and 14B are schematic views of a cooling structure and a metal spacer for use with the inventive logic module.
Figure 14B:
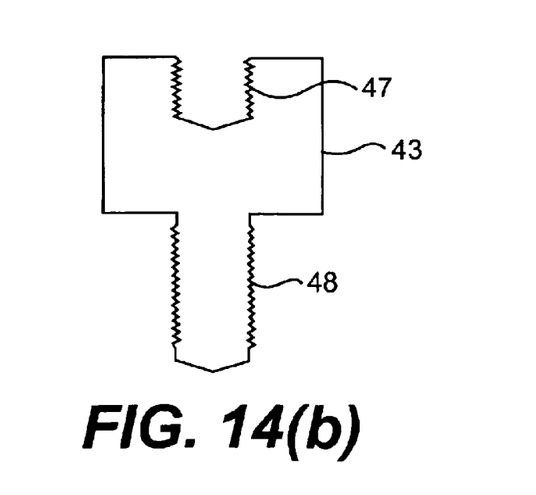

A cooling structure for the logic module 1 will now be described with reference to FIGS. 14A through 17. FIGS. 14A and 14B are schematic views of a typical cooling structure for use with the inventive logic module.

In FIG. 14A, four corners of the logic module 1 are furnished with radiation plates 42 with metal spacers 43 interposed therebetween. The radiation plates 42 are topped with cooling fins or a cooling fan 44. Heat conduction sheets 41 are interposed between the radiation plates 42 on the one hand and the logic LSIs 4 such as FPGAs mounted on the logic module 1 on the other hand. The heat conduction sheets 41 elastically conform to and snugly contact the shape of each logic LSI 4. Heat from the LSIs 4 is dissipated through the heat conduction sheets 42 which in turn are cooled by the cooling fins or cooling fan 44. A heat conduction sheet 41 is typically made of silicon rubber having metal particles of silver or like metal of high thermal conductivity dispersed as fillers in the elastic substance. A radiation plate is illustratively formed by copper or aluminum. The metal spacer is typically composed of brass plated with nickel.

FIG. 14B is a cross-sectional view of a metal spacer 43. The metal spacers 43, each having a tapped hole 47 as well as a tap 48, may be connected one after another in series. Screws 45 are used to attach a radiation plate 42 to metal spacers 43. The metal spacers 43 are also used to fix the logic module 1 to the logic board 21, with the logic board 21 fastened with nuts 46 on its back.

As indicated, the heat conduction sheets 41 accommodate different heights of multiple LSIs on the same surface for collective cooling. Such a heat conduction-based cooling structure alleviates mechanical stress exerted on LSI chips mounted face down in flip-chip packaging.

If the radiation plate 42 and the module board 2 are arranged to approximate each other in terms of thermal expansion coefficient, both are protected against deflection due to a difference of the coefficient. Such an arrangement also enhances the radiation effect by increasing the adhesion between the LSI chips and heat conduction sheets as well as between the heat conduction sheets and the radiation plates. For example, common glass epoxy plates have a thermal expansion coefficient of about 15 ppm/C while copper plates have the coefficient of 17 ppm/C. With their thermal expansion coefficients in approximate coincidence, the two substances may be used advantageously to provide effective cooling.

The metal spacers are located in the four corners of the module board. The locations of the spacers do not interfere with the layout of parts and wiring, which makes logic module design easier.

Although the cooling structure example shown in FIG. 14A addresses a single logic module, this is not limitative of the invention. The same structure may also be applied to a multiple-stage logic module setup.

Figure 15:
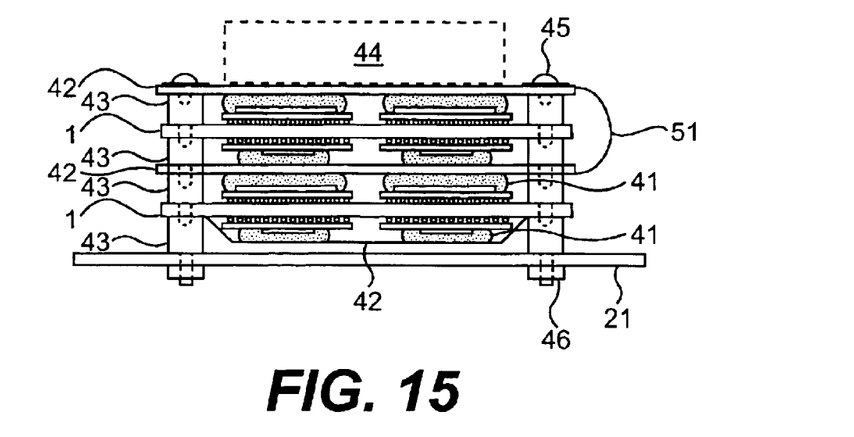
FIG. 15 is a schematic view of a cooling structure for a multiple-stage logic module arrangement.

FIG. 15 is a schematic view of a cooling structure for a multiple-stage logic module arrangement. In FIG. 15, the cooling structure on the face of a lower-stage logic module 1 is the same as that of FIG. 14A and thus will not be described further. Heat generated by LSIs on the back of an upper-stage logic module 1 is thermally conducted to a radiation plate 42 on the face of the lower-stage logic module 1. One edge of a freely flexible heat conduction sheet 51 is attached to the radiation plate 42 by means of heat conduction adhesive 52. Another edge of the heat conduction sheet 51 is attached to a radiation plate on the face of the upper-stage logic module also using the heat conduction adhesive 52. This structure ensures efficient heat conduction. The freely flexible heat conduction sheet 51 is illustratively structured as a flexible board, e.g., a polyimide tape plated with copper foil about hundreds of micrometers thick, or a graphite sheet made from a polymer plastic sheet turned into a crystal structure at high temperature. A graphite sheet called PGS (pyrolytic graphite sheet) is available from Matsushita Electric Industrial Co., Ltd. in Japan.

Figure 16:
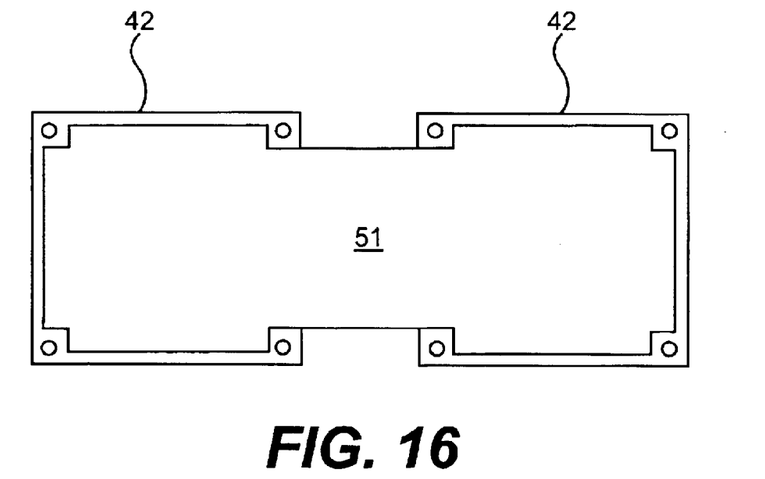
FIG. 16 is a spread view of radiation plates on which a flexible heat conduction sheet is pasted.
Figure 17:
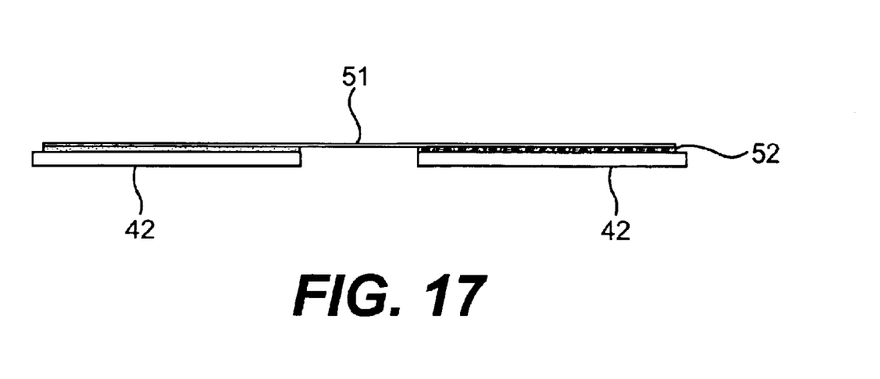
FIG. 17 is a cross-sectional view of radiation plates to which a flexible heat conduction sheet is attached

FIG. 16 is a spread view of radiation plates on which a flexible heat conduction sheet is pasted. FIG. 17 is a cross-sectional view of such a sheet-plate combination.

In the manner described above, the heat from the lower-stage logic module 1 and the heat from the LSIs on the back of the upper-stage logic module 1 are thermally conducted to the radiation plates of the upper-stage logic module 1 via the flexible heat conduction sheet 51. The heat thus conveyed is dissipated by the cooling fins or cooling fan 44 attached to the radiation plates.

As described and according to the invention, a plurality of logic LSIs are mounted on a single logic module, and these LSIs are interconnected either directly or by way of switching LSIs. This provides a module setup that ensures efficient wiring in the smallest possible space for element placement.

Where an external connector arrangement is used, a multiple-stage module setup is made available for further logic expansion per unit area. The logic LSIs are directly connected to the logic board targeted for logic verification. After the logic verification, the LSI under development is mounted on the board with no need to design another logic board. In addition, a cooling structure that enhances heat conductivity while alleviating stress on LSI chips without obstructing the component layout is provided to cool efficiently not only an individual module but also a multiple-stage module setup. Where logic modules are configured by programmable LSIs for programming logic and by switching LSIs for programming connections, the inventive arrangement permits a high degree of freedom in wiring while minimizing the number of pins on the switching LSTs. With control signals connected to both the device interface connector and the external interface connector, control operations are made possible through the two connectors.

As many apparently different embodiments of this invention may be made without departing from the spirit and scope thereof, it is to be understood that the invention is not limited to the specific embodiments thereof except as defined in the appended claims.

What is claimed is:

1. A logic emulation module comprising:
   a plurality of programmable LSIs capable of programming logic;
   a plurality of switching LSIs capable of programming connections between said plurality of programmable LSIs;
   connectors for electrical connection to entities external to the module;
   a board on which to mount said plurality of programmable LSIs, said plurality of switching LSIs and said connectors; and
   wiring furnished on said board for carrying data during emulation;
   wherein said wiring at least includes lines for directly coupling said connectors to said programmable LSIs and lines for linking said connectors to said programmable LSIs by way of said switching LSIs;
   wherein on said logic emulation module, at least a part of logically equivalent functions to an LSI to be developed which includes core cell logic is mounted on a logic board prepared for logic verification, is realized without distinction between core cell and peripheral logic, and
   wherein each of said plurality of programmable LSIs is directly connected to all of the other of said plurality of programmable LSIs and is coupled to all of said plurality of switching LSIs.

2. A logic emulation module according to claim 1, wherein said plurality of programmable LSIs and said plurality of switching LSIs are mounted on a face and a back of said board.

3. A logic emulation module according to claimed 2, wherein said LSIs are mounted in opposite fashion on said face and said back of said board, and wherein signal lands shared by said LSIs are positioned in opposite fashion on the two sides of said board, said signal lands being interconnected by use of through-holes.

4. A logic emulation module according to claim 3, wherein said programmable LSIs are mounted on said face of said board, and said switching LSIs and connectors for connection to a logic board are mounted on said back of said board.

5. A logic emulation module according to claim 1, wherein said connectors are furnished on a face and a back of said board.

6. A logic emulation module according to claim 5, wherein, of pins on said connectors, at least those for power supply and ground lines are positioned in opposite fashion on said face and said back of said board and connected by use of through-holes.

7. A logic module on a board, at least on one side of said board comprising:
   a plurality of programmable logic elements;
   connectors for exchanging input and output signals to and from said plurality of programmable logic elements; and
   switching elements for controlling connections between said plurality of programmable logic elements; and
   terminal lands for supporting an LSI targeted for development and mounted on said board,
   wherein said plurality of programmable logic elements are connected either to said connectors or to said switching elements; and
   wherein logic data for logic verification are programmed in said plurality of programmable logic elements; and
   wherein each of said plurality of programmable logic elements is directly connected to all of the other of said plurality of programmable logic elements and is coupled to all of said switching elements.

8. A logic module according to claim 7, wherein said connectors are furnished on a first and a second side of said board at the same edge thereof, and wherein some of oppositely located terminals of said connectors on said first and said second side of said board transmit the same signal each.

9. A logic module according to claim 7, wherein said plurality of programmable logic elements are furnished on at least part of a first side of said board;
   wherein said switching elements are located on a second side of said board in opposite relation with said plurality of programmable logic elements;
   wherein a second board with a predetermined land layout is interposed between said plurality of programmable logic elements or said switching elements on the one hand and said board on the other hand; and
   wherein some of terminals provided for said plurality of programmable logic elements and dealing with the same signals as some of terminals provided for said switching elements are connected to the latter terminals by through-holes furnished on said second board.

10. A logic module comprising:
    a plurality of programmable large-scale integrated circuits in which logic may be programmed;
    a plurality of switching large-scale integrated circuits in which connections may be programmed;
    a board for supporting said programmable large-scale integrated circuits and said switching large-scale integrated circuits;
    a connector for transmitting signals of said programmable large-scale integrated circuits;
    a terminal land for supporting an LSI targeted for development and mounted on said board;
    first wirings for connecting each of said plurality of programmable large-scale integrated circuits to all of said plurality of switching large-scale integrated circuits;

second wirings for interconnecting between each of said plurality of programmable large-scale integrated circuits and all of the other said plurality of programmable large-scale integrated circuits;

third wirings for connecting each of said plurality of programmable large-scale integrated circuits to said connector; and fourth wirings for connecting each of said plurality of switching large-scale integrated circuits to said connector;

wherein said first through said fourth wiring are used to connect logic signals constituting logic.

11. A logic module according to claim 10, wherein said connector is made of a first and a second connector located in opposite relation with each other on said logic board;

wherein oppositely positioned first terminals of said first and said second connector transmit a first control signal connected in parallel to said programmable large-scale integrated circuits and said switching large-scale integrated circuits;

wherein oppositely positioned second terminals of said first and said second connector transmit an input signal of a second control signal connecting said programmable large-scale integrated circuits to said switching large-scale integrated circuits in series; and wherein oppositely positioned third terminals of said first and said second connector transmit an output signal of said second control signal connecting said programmable large-scale integrated circuits to said switching large-scale integrated circuits in series.

12. A multi-chip module comprising:

a plurality of integrated circuits;

connectors for electrical connection to entities external to the module;

a board on which to mount said plurality of integrated circuits and said connectors, said integrated circuits and said connectors being mounted on a first side of said board and a second side which is opposite to the first side of said board;

first and second radiation plates attached to four corners of said multi-chip module for covering said integrated circuits;

first metal spacers interposed between said first radiation plates and the first side of said board, said metal spacers being attached to the four corners of said multi-chip module with said first radiation plates;

second metal spacers interposed between said second radiation plate and the second side of said board, said metal spacers being attached to the four corners of said multi-chip module with said second radiation plate;

a first heat conduction sheet interposed between said integrated circuits mounted on the first side of said board and said first radiation plates; and a second heat conduction sheet interposed between said integrated circuit mounted on the second side of said board and said second radiation plate, wherein said heat conduction sheet elastically conforms to and closely contacts the shapes of said integrated circuits, and wherein one edge of a flexible heat conduction sheet is attached to the first radiation plates of said first side of said board;

wherein another edge of said flexible heat conduction sheet is attached to the second radiation plate of said second side of said board, and wherein the opposite plane of the radiation plates of the first side of said board is capable of providing with an integrated circuit mounted on another board.

13. A logic module according to claim 7, further comprising:

a plurality of terminal lands for connecting terminals of said plurality of programmable logic elements, wherein said plurality of terminal lands and said connectors are located in peripheral portions of said board where said programmable logic elements are mounted, wherein said terminal lands and terminals of said connectors are linked on a one-to-one basis, and wherein each of said connectors is stacking type connector.

* * * * *